(12) United States Patent
Sakai et al.

(10) Patent No.: US 9,253,881 B2
(45) Date of Patent: Feb. 2, 2016

(54) MULTILAYER FLEXIBLE SUBSTRATE

(71) Applicant: Murata Manufacturing Co., Ltd., Nagaokakyo-shi, Kyoto-fu (JP)

(72) Inventors: Norio Sakai, Nagaokakyo (JP); Yoshihito Otsubo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 367 days.

(21) Appl. No.: 13/903,119

(22) Filed: May 28, 2013

(65) Prior Publication Data

US 2013/0256001 A1    Oct. 3, 2013

Related U.S. Application Data

(63) Continuation of application No. PCT/JP2011/075891, filed on Nov. 10, 2011.

(30) Foreign Application Priority Data

Nov. 29, 2010    (JP) .................................. 2010-265362

(51) Int. Cl.
| | |
|---|---|
| *H05K 1/00* | (2006.01) |
| *H05K 1/02* | (2006.01) |
| *H05K 3/46* | (2006.01) |
| *H05K 1/11* | (2006.01) |
| *H05K 3/40* | (2006.01) |

(52) U.S. Cl.
CPC .............. *H05K 1/0298* (2013.01); *H05K 1/115* (2013.01); *H05K 3/4691* (2013.01); *H05K 3/4069* (2013.01); *H05K 2201/0391* (2013.01)

(58) Field of Classification Search
USPC .......... 174/250, 253–255, 257–258, 261–263
See application file for complete search history.

(56) References Cited

U.S. PATENT DOCUMENTS

2007/0281505 A1    12/2007    Kobayashi et al.

FOREIGN PATENT DOCUMENTS

| JP | 2000-183526 A | 6/2000 |
|---|---|---|
| JP | 2002-176236 A | 6/2002 |
| JP | 2005-322871 A | 11/2005 |

OTHER PUBLICATIONS

Official Communication issued in International Patent Application No. PCT/JP2011/075891, mailed on Dec. 6, 2011.

*Primary Examiner* — Tremesha S Willis
(74) *Attorney, Agent, or Firm* — Keating & Bennett, LLP

(57) ABSTRACT

A multilayer flexible substrate includes a first structural layer including at least one resin sheet including an insulating layer, a wiring conductor provided on a principal surface of the insulating layer, and filled vias disposed in the insulating layer; and a second structural layer provided on a principal surface of a portion of the first structural layer and including at least one resin sheet including an insulating layer, a wiring conductor provided on a principal surface of the insulating layer, and a filled via provided in the insulating layer. The multilayer flexible substrate includes rigid regions and a flexible region that is more flexible than the rigid regions. In the multilayer flexible substrate, the filled via disposed in the flexible region has a higher porosity than the filled via disposed in the second structural layer.

19 Claims, 2 Drawing Sheets

MULTILAYER FLEXIBLE SUBSTRATE

BACKGROUND OF THE INVENTION

1. Field of the Invention

The present invention relates to a multilayer flexible substrate including two types of different regions: a rigid region and a flexible region that is more flexible than the rigid region.

2. Description of the Related Art

Increasingly downsized electronic devices, such as notebook personal computers and cellular phones, are requiring thin, flexible mounting boards to optimize limited mounting spaces. Such a mounting board is disclosed in, for example, Japanese Unexamined Patent Application Publication No. 2000-183526. With reference to FIG. 3, a multilayer wiring board 100 disclosed in Japanese Unexamined Patent Application Publication No. 2000-183526 includes a laminate 103 including insulating substrates 101 and wires 102 alternately stacked, through-holes 104 disposed in the insulating substrates 101, and filled vias formed by filling the through-holes 104 with a conductor 105. The wires 102 are electrically connected to each other through the filled vias. The laminate 103 includes a bending portion 106 formed by partially reducing the thickness of the laminate 103.

The multilayer wiring board 100 includes a structure including rigid portions located at both ends of the multilayer wiring board 100 and the bending portion 106, which connects these two portions and is flexible. In this structure, the rigid portions are referred to as "rigid regions" and the bending portion 106, which connects the two rigid portions, is referred to as a "flexible region". A substrate having such a structure is referred to as a "multilayer flexible substrate". A multilayer flexible substrate is a type of circuit board.

When manufacturing such a multilayer flexible substrate, wires have been connected to each other through the same filled vias disposed in rigid regions and a flexible region. However, when the filled vias are disposed in the flexible region, there is a problem in that flexibility sufficient to bend the multilayer flexible substrate is not achieved because the filled vias reduce the flexibility of the flexible region.

SUMMARY OF THE INVENTION

Accordingly, preferred embodiments of the present invention provide a multilayer flexible substrate capable of achieving flexibility that is sufficient to be bent even though a filled via is disposed in a flexible region.

A multilayer flexible substrate according to a preferred embodiment of the present invention includes a first structural layer including at least one resin sheet including an insulating layer, a wiring conductor provided on a principal surface of the insulating layer, and a filled via provided in the insulating layer and also includes a second structural layer which is provided on a principal surface of a portion of the first structural layer and which includes at least one resin sheet including an insulating layer, a wiring conductor provided on a principal surface of the insulating layer, and a filled via disposed in the insulating layer. The multilayer flexible substrate includes a rigid region including a portion of the first structural layer and the second structural layer and a flexible region that is more flexible than the rigid region. The filled via disposed in the flexible region has a higher porosity than the filled via disposed in the second structural layer.

In this case, the filled vias, which are disposed in the resin sheets and are hardest, include fine voids. Thus, the density of the filled vias is low and the entire flexible region is relatively flexible. Therefore, flexibility sufficient to bend the multilayer flexible substrate is achieved.

The filled via disposed in the first structural layer preferably has a higher porosity than the filled via disposed in the second structural layer. In this case, the type of the filled vias is determined depending on the structural layers and, therefore, the resin sheets are easily provided.

The filled via disposed in the first structural layer and the filled via disposed in the second structural layer are preferably filled with the same or substantially the same alloy. In this case, the porosity of each calcined filled via can be varied by varying the content of organic substances included in a metal paste of the uncalcined filled via. Thus, the porosity is easily adjusted.

According to various preferred embodiments of the present invention, a filled via which is disposed in a resin sheet and which is hardest includes fine voids. Thus, the density of the filled via is low and the entire flexible region is relatively flexible. Therefore, flexibility sufficient to bend a multilayer flexible substrate is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Multilayer flexible substrates according to preferred embodiments of the present invention will be described below with reference to the drawings.

First Preferred Embodiment

Figure 1:
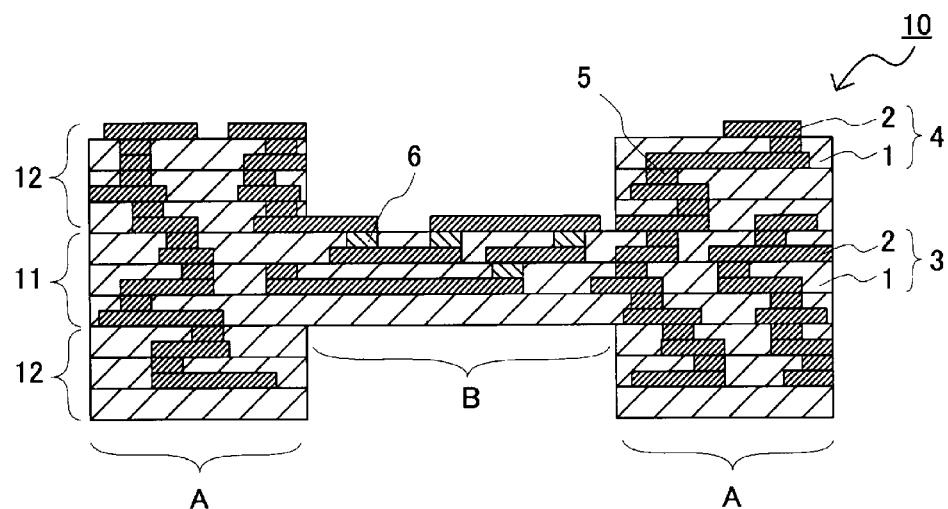
FIG. 1 is a schematic sectional view of a multilayer flexible substrate according to a first preferred embodiment of the present invention.

FIG. 1 is a schematic sectional view of a multilayer flexible substrate 10 according to a first preferred embodiment of the present invention. In this specification, sectional views are schematic for better understanding.

The multilayer flexible substrate 10 according to the first preferred embodiment includes a first structural layer 11 and second structural layers 12. The multilayer flexible substrate 10 includes rigid regions A and a flexible region B that is more flexible than the rigid regions A.

The first structural layer 11 preferably includes three resin sheets 3 that are sequentially stacked. The resin sheets 3 each include an insulating layer 1, a wiring conductor 2 provided on a principal surface of the insulating layer 1, and filled vias 5 and 6 which are disposed in the insulating layer 1 and which electrically connect the wiring conductor 2 to a wiring conductor 2 provided on another sheet.

The insulating layer 1 is a thin plate and is flexible. The insulating layer 1 is preferably made of, for example, a liquid crystal polymer (LCP).

The wiring conductor 2 is provided on a principal surface of the insulating layer 1 and is preferably made of, for example, copper.

The filled vias 5 and 6 are disposed in the insulating layer 1 and are preferably filled with, for example, a Sn—Cu—Ni alloy.

The second structural layers 12 each include resin sheets 4 stacked on a portion of a principal surface of the first structural layer 11. In particular, three of the resin sheets 4 are preferably stacked on each of two end portions of both principal surfaces of the first structural layer 11. The resin sheets 4 each include an insulating layer 1, a wiring conductor 2 provided on a principal surface of the insulating layer 1, and a filled via 5 which is disposed in the insulating layer 1 and which electrically connects the wiring conductor 2 to a wiring conductor 2 provided on another sheet.

The multilayer flexible substrate 10 is tabular. The resin sheets 3 and 4 define the rigid regions A and the flexible region B depending on the number of the stacked resin sheets 3 and 4. The multilayer flexible substrate 10 preferably includes the two rigid regions A and one the flexible region B, which is located between the two rigid regions A.

The rigid regions A are portions that include the first structural layer 11 and the second structural layers 12 that are stacked on one another. The flexible region B is a portion that includes a portion of the first structural layer 11 other than the portions in the rigid regions A.

The rigid regions A and the flexible region B include the insulating layers 1, which are preferably made of the same material, such as the liquid crystal polymer (LCP), and are stacked on one another. The number of insulating layers 1 stacked in each rigid region A is greater than the number of insulating layers 1 stacked in the flexible region B.

The multilayer flexible substrate 10 varies in strength depending on the number of stacked layers and, therefore, the flexible region B is more flexible than the rigid regions A. Not only the flexible region B but also the rigid regions A are flexible to a significant extent.

Two types of filled vias 5 and 6 are provided in the multilayer flexible substrate 10. The filled vias 6 provided in the flexible region B have a higher porosity than the filled vias 5 provided in the second structural layers 12. The porosity is herein defined as the area fraction of pores. The pore area fraction is determined such that a laminate is mirror-polished in parallel to a principal surface thereof until a region having pores is exposed, a polished cross-section is examined with a scanning electron microscope (SEM), and the area of pores per unit area in a sintered ceramic is measured.

In particular, in the first structural layer 11, the filled vias 5 having the same porosity as that of the filled vias 5 disposed in the second structural layers 12 are provided in portions of the insulating layers 1 in each rigid region A and the filled vias 6 which have a higher porosity than the filled vias 5 are provided in a portion of the insulating layers 1 in the flexible region B.

A non-limiting example of a method of varying the porosity of filled vias according to a preferred embodiment of the present invention is described below.

The filled vias 5 and 6 are formed such that via-holes are formed in the insulating layers 1 and metal pastes are filled into the via-holes and then heat-treated. Therefore, when the multilayer flexible substrate 10 is formed, the type of metal paste filled into the via-holes in portions of the insulating layers 1 defining the rigid regions A and the type of the metal paste filled into the via-holes formed in the portion of the insulating layers 1 defining the flexible region B are changed.

The metal paste filled into the via-holes formed in the portions of the insulating layers 1 defining the rigid regions A preferably primarily includes, for example, Sn/Cu and is prepared such that Sn/Cu is mixed with a conductive adhesive such as an epoxy adhesive and an organic solvent such as terpineol, for example. The metal paste is preferably prepared such that Sn with an average particle size of, for example, about 5 μm and Cu with an average particle size of, for example, about 5 μm are mixed together and the content of organic substances (the adhesive and the organic solvent) included in the metal paste is adjusted to, for example, about 10% by weight.

The metal paste filled into the via-holes formed in the portion of the insulating layers 1 defining the flexible region B preferably primarily includes, for example, Sn/Cu and is prepared such that Sn/Cu is mixed with a conductive adhesive such as an epoxy adhesive and an organic solvent such as terpineol. However, the content of organic substances included in the metal paste is different and is preferably, for example, about 20% by weight.

The content of the organic substances included in the metal paste filled into the via-holes formed in the portions of the insulating layers 1 defining the flexible region B may preferably be any value in a range of about 10% by weight to about 50% by weight, for example.

A plurality of the resin sheets 3 or 4 filled with these metal pastes are hot-pressed under the following conditions: for example, about 280° C. and about 4.0 MPa. This results in the insulating layers 1 being bonded to each other; Sn and Cu, which are metal components of these metal pastes, being alloyed into the filled vias, which are alloyed with a metal used in the wiring conductors; the organic substances contained in each metal paste being vaporized by heat; and therefore voids being formed at sites at which the organic substances are included.

As the amount of voids increases, the density of the filled vias decreases such that the entire flexible region B is more flexible. Thus, flexibility sufficient to bend the multilayer flexible substrate 10 is achieved.

The porosity of the filled vias may be varied by varying not only the content of the organic substances included in the metal paste, but also by changing a printing process. For example, a method may be used in which ordinary printing is used for sites at which the porosity needs to be high and vacuum printing is used for sites at which the porosity needs to be low.

In the present preferred embodiment, the filled vias provided in the first and second structural layers are preferably filled with the same or substantially the same alloy. This configuration allows the porosity of the filled vias to be varied by varying the content of the organic substances included in the metal paste used to form the uncalcined filled vias. Thus, the porosity can be easily adjusted.

In the present preferred embodiment, a plurality of the insulating layers, which define the first and second structural layers, are preferably all flexible. This configuration enables the rigid regions and the flexible region to be formed by stacking the same insulating layers on one another.

Second Preferred Embodiment

Figure 2:
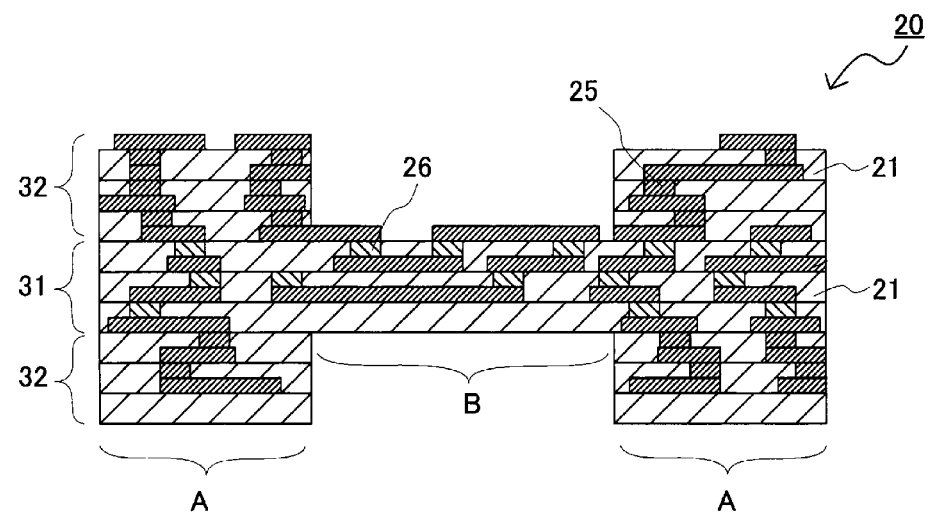
FIG. 2 is a schematic sectional view of a multilayer flexible substrate according to a second preferred embodiment of the present invention.
Figure 3:
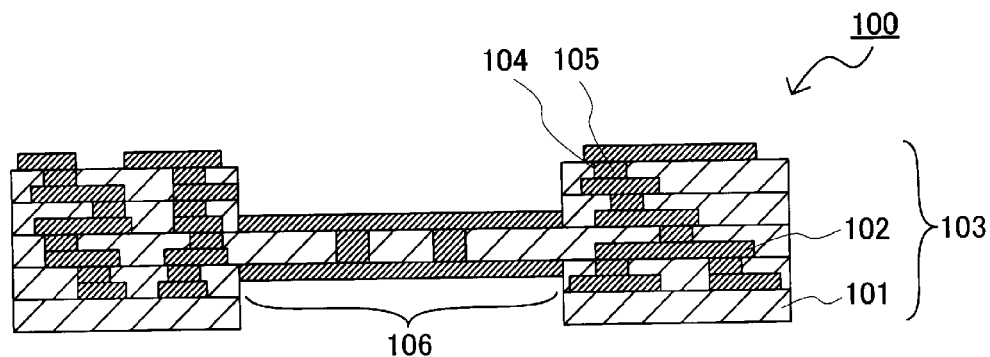
FIG. 3 is a schematic sectional view of a multilayer flexible substrate according to a conventional technique.

FIG. 2 is a schematic sectional view of a multilayer flexible substrate 20 according to a second preferred embodiment of the present invention.

The multilayer flexible substrate 20 according to the second preferred embodiment includes filled vias 26 having a higher porosity than filled vias 25 provided in second structural layers 32 provided in all of insulating layers 21 defining a first structural layer 31. This configuration enables the density of the filled vias to be relatively low and the entire flexible region to be flexible. Therefore, flexibility sufficient to bend the multilayer flexible substrate is achieved. Furthermore, the type of the filled vias is determined depending on the structural layers and, therefore, resin sheets are easily provided.

A multilayer flexible substrate according to the present invention is not limited to the preferred embodiments described above and may be variously modified within the scope thereof.

In the above-described preferred embodiments, the insulating layers are preferably made of, for example, the liquid crystal polymer (LCP), but are not limited thereto. The insulating layers may alternatively be made of an insulator, that is, for example, a thermoplastic resin such as polyimide, PEEK, or PPS or a thermosetting resin.

In the above-described preferred embodiments, the wiring conductors are preferably made of Cu, but are not limited thereto. For example, a metal such as Ag, Al, Ni, Au, or SUS, an alloy of these metals, or other suitable material may be used.

In the above-described preferred embodiments, the filled vias are preferably filled with the Sn/Cu alloy, but are not limited thereto. The filled vias may be filled with, for example, a Sn/Au alloy, a Sn/Ag/Cu alloy, or other suitable alloy.

In the above-described preferred embodiments, all the insulating layers are preferably flexible. However, some or all of the second structural layers may include a non-flexible insulating layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer flexible substrate comprising: a first structural layer including at least one resin sheet including a first insulating layer, a first wiring conductor provided on a principal surface of the first insulating layer, and first filled vias provided in the first insulating layer; and a second structural layer which is provided on a portion of a principal surface of the first structural layer and which includes at least one resin sheet including a second insulating layer, a second wiring conductor provided on a principal surface of the second insulating layer, and a second filled via disposed in the second insulating layer; wherein the multilayer flexible substrate includes a rigid region including a portion of the first structural layer and the second structural layer and a flexible region that is more flexible than the rigid region and including another portion of the first structural layer; the first filled vias are provided in the rigid region and in the flexible region; the first filled vias provided in the flexible region have a higher porosity than the second filled via provided in the second structural layer.

2. The multilayer flexible substrate according to claim 1, wherein all of the first filled vias provided in the first structural layer have a higher porosity than the second filled via provided in the second structural layer.

3. The multilayer flexible substrate according to claim 1, wherein the first filled vias provided in the first structural layer and the second filled via provided in the second structural layer are filled with a same alloy.

4. The multilayer flexible substrate according to claim 1, wherein the first filled vias provided in the flexible region of the first structural layer have a higher porosity than the first filled vias provided in the rigid region of the first structural layer.

5. The multilayer flexible substrate according to claim 1, wherein the first structural layer includes three resin sheets that are stacked on one another.

6. The multilayer flexible substrate according to claim 1, wherein the first insulating layer is made of liquid crystal polymer.

7. The multilayer flexible substrate according to claim 1, wherein the first wiring conductor is made of copper.

8. The multilayer flexible substrate according to claim 1, wherein the first filled vias are filled with a Sn—Cu—Ni alloy.

9. The multilayer flexible substrate according to claim 1, wherein the second filled via is filled with a Sn—Cu—Ni alloy.

10. The multilayer flexible substrate according to claim 1, wherein the first filled vias and the second filled via are filled with a Sn—Cu—Ni alloy.

11. The multilayer flexible substrate according to claim 1, further comprising:
an additional rigid region; wherein
the rigid region and the additional rigid region are spaced apart from one another with the flexible region disposed therebetween.

12. The multilayer flexible substrate according to claim 11, further comprising:
at least one additional second structural layers; wherein
at least one of the second structural layers and the at least one additional second structural layer is provided in one of the rigid regions and the additional rigid region; and
at least another one of the second structural layer and the at least one additional second structural layer is provided in the other of the rigid regions and the additional rigid region.

13. The multilayer flexible substrate according to claim 12, each of the second structural layer and the at least one additional second structural layer includes the second insulating layer and two additional second insulating layers that are stacked on one another.

14. The multilayer flexible substrate according to claim 1, wherein the second insulating layer is made of liquid crystal polymer.

15. The multilayer flexible substrate according to claim 1, wherein the second wiring conductor is made of copper.

16. The multilayer flexible substrate according to claim 1, wherein the first insulating layer is made of one of a thermoplastic resin and a thermosetting resin.

17. The multilayer flexible substrate according to claim 1, wherein the first wiring conductor is made of one of Ag, Al, Ni, Au, and SUS, or an alloy thereof.

18. The multilayer flexible substrate according to claim 1, wherein the second insulating layer is made of one of a thermoplastic resin and a thermosetting resin.

19. The multilayer flexible substrate according to claim 1, wherein the second wiring conductor is made of one of Ag, Al, Ni, Au, and SUS, or an alloy thereof.

* * * * *